US006870416B2

(12) United States Patent
Cho (10) Patent No.: US 6,870,416 B2
(45) Date of Patent: Mar. 22, 2005

(54) SEMICONDUCTOR DEVICE WITH CLOCK ENABLE BUFFER TO PRODUCE STABLE INTERNAL CLOCK SIGNAL

(75) Inventor: Kwang-Rae Cho, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/617,180

(22) Filed: Jul. 11, 2003

(65) Prior Publication Data

US 2004/0095180 A1 May 20, 2004

(30) Foreign Application Priority Data

Nov. 20, 2002 (KR) ................................ 10-2002-0072247

(51) Int. Cl.[7] ............................................... H03K 3/00
(52) U.S. Cl. .................. 327/299; 387/108; 365/189.05
(58) Field of Search ............................ 327/108, 109, 327/291, 299; 365/233, 233.5, 189.05

(56) References Cited

U.S. PATENT DOCUMENTS

| 5,838,630 A | * | 11/1998 | Okajima ..................... 365/233 |
| 5,880,998 A | * | 3/1999 | Tanimura et al. ...... 365/189.05 |
| 6,037,813 A | * | 3/2000 | Eto et al. ..................... 327/156 |
| 6,154,415 A | * | 11/2000 | Jeong .......................... 365/233 |
| 6,192,429 B1 | * | 2/2001 | Jeong et al. .................. 710/58 |
| 6,359,487 B1 | | 3/2002 | Heightley et al. .......... 327/276 |

FOREIGN PATENT DOCUMENTS

| JP | 2-244656 | 9/1990 | ........... H01L/21/82 |
| JP | 9-198875 | 7/1997 | ......... G11C/11/413 |
| JP | 11-15783 | 1/1999 | ........... G06F/13/42 |
| JP | 2001-44283 | 2/2001 | ........... H01L/21/82 |
| JP | 2001-222887 | 8/2001 | ......... G11C/11/407 |
| JP | 2002-367391 | 12/2002 | ........... G11C/19/28 |

\* cited by examiner

Primary Examiner—Minh Nguyen
(74) Attorney, Agent, or Firm—Piper Rudnick LLP (57) ABSTRACT

A semiconductor device includes a clock buffer block for receiving and buffering an external clock signal and then outputting an internal clock in response is a second control signal; a clock enable buffer block, which is enabled by a buffer enable signal, for comparing a reference voltage having a constant potential with a clock enable buffer signal and then generating a first control signal; a clock enable signal timing control block for outputting the second control signal by passing the clock enable signal to the clock buffer block in response to the buffer enable signal or by delaying the clock enable signal for a predetermined time; and a clock enable signal latch block for generating the enable signal after a power-up signal is inputted.

11 Claims, 8 Drawing Sheets

FIG. 8

SEMICONDUCTOR DEVICE WITH CLOCK ENABLE BUFFER TO PRODUCE STABLE INTERNAL CLOCK SIGNAL

FIELD OF THE INVENTION

The present invention relates to a semiconductor device and, more particularly, to a clock enable buffer to output a clock enable signal which enables a clock buffer to produce an internal clock signal.

DESCRIPTION OF THE RELATED ART

Generally, semiconductor devices receive an external clock signal from an external circuit and then operate based on such an external clock signal. As a result, the external clock signal is used as a reference timing signal in the semiconductor devices. Particularly, a synchronous DRAM of memory devices performs read and write operations in synchronization with an external clock signal from an external circuit. Therefore, the synchronous DRAM includes a clock buffer, which buffers the external clock signal and transfers the buffered clock signal to an internal circuit therein, and an clock enable buffer to control the clock buffer.

The clock enable buffer latches the clock enable buffer signal and then outputs it to the clock buffer. The clock buffer is enabled according to an enable signal outputted from the clock enable buffer so that it buffers the external clock signal and outputs the internal clock signal to the semiconductor device.

Since the typical semiconductor devices use the internal clock signal as a reference timing and the whole operations are carried out based on the reference timing, it is very important for the clock enable buffer to operate exactly.

Figure 1:
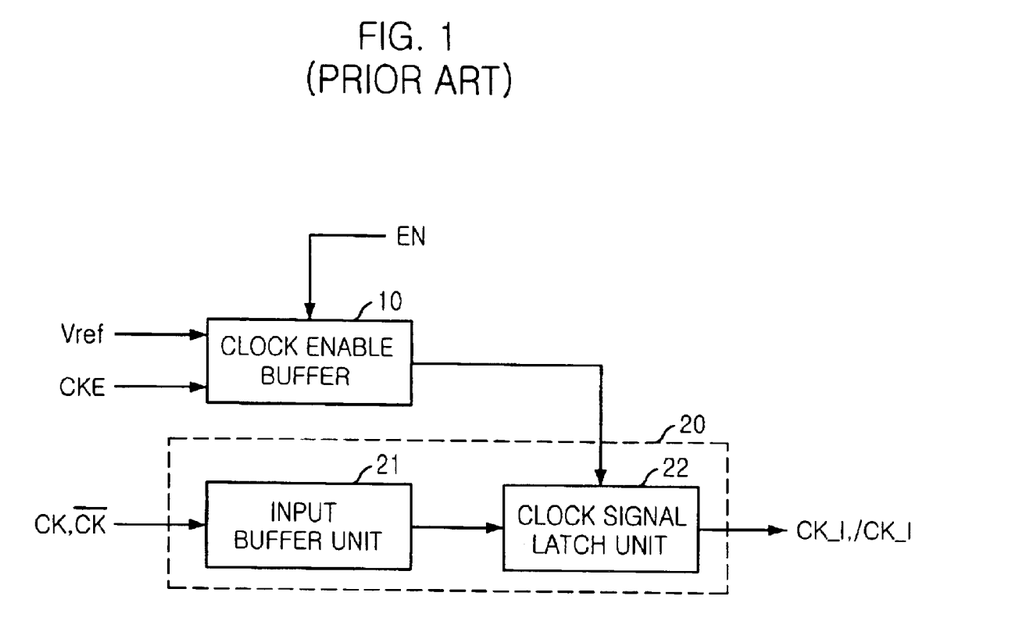
FIG. 1 is a block diagram illustrating an input unit receiving a clock signal in a conventional semiconductor device.

FIG. 1 is a block diagram illustrating an input unit receiving a clock signal in a conventional semiconductor device. Referring to FIG. 1, a clock signal input unit of the conventional semiconductor device includes a clock buffer 20, which buffers clock signals CK and /CK and outputs the buffered clock signals CK and /CK, and a clock enable buffer 10 to enable the clock buffer 20.

The clock buffer 20 includes an input buffer unit 21 receiving and buffering the clock signal CK and /CK and a clock signal latch unit 22 which is enabled according to an output signal from the clock enable buffer 10 and then latches a signal outputted from the clock enable buffer 10 in order to output internal clock signals CK_I and /CL_I.

Also, the clock enable buffer 10 is enabled according to an enable signal EN and enables a clock signal latch unit 30 by receiving a reference voltage Vref and a clock enable buffer signal CKE.

Figure 2:
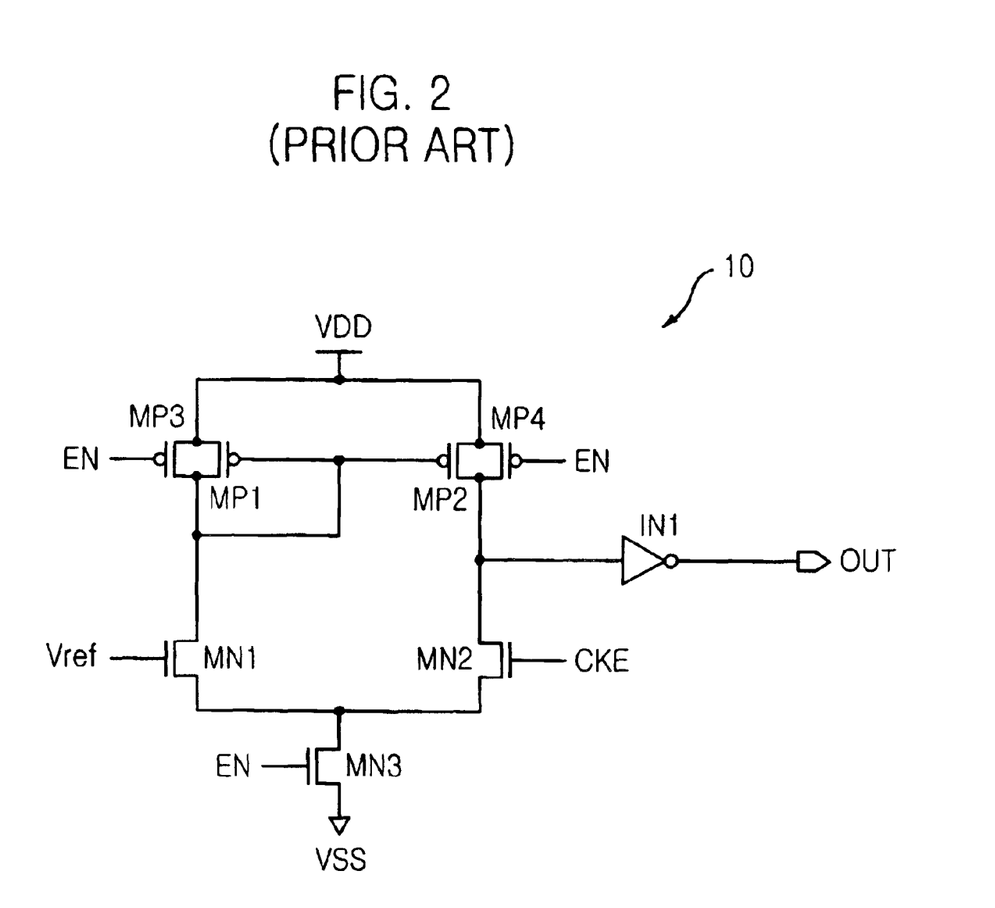
FIG. 2 is a circuit diagram illustrating a clock enable buffer in FIG. 1.

FIG. 2 is a circuit diagram illustrating the clock enable buffer in FIG. 1. Referring to FIG. 2, the clock enable buffer 10 includes: NMOS transistors MN1 and MN2 which have gates receiving the reference voltage Vref and the clock enable buffer signal CKE, respectively; an NMOS transistor MN3 which has a gate receiving the enable signal EN and is connected to the NMOS transistors MN1 and MN2 and a ground voltage level VSS; a PMOS transistor MP1 which has a gate connected to the NMOS transistor MN1 in a diode connection and is connected to a power voltage VDD; a PMOS transistor MP2 which is connected to the power voltage VDD and the NMOS transistor MN2 to form a current mirror together with the PMOS transistor MP1; a PMOS transistor MP3 which has a gate receiving the enable signal EN and is connected to the NMOS transistor MN1 and the power voltage VDD; a PMOS transistor MP4 which has a gate receiving the enable signal EN and is connected to the NMOS transistor MN2 and the power voltage VDD; and an inverter IN1 for inverting an output signal on a common node of the PMOS transistor MP2 and the NMOS transistor MN2.

Figure 3:
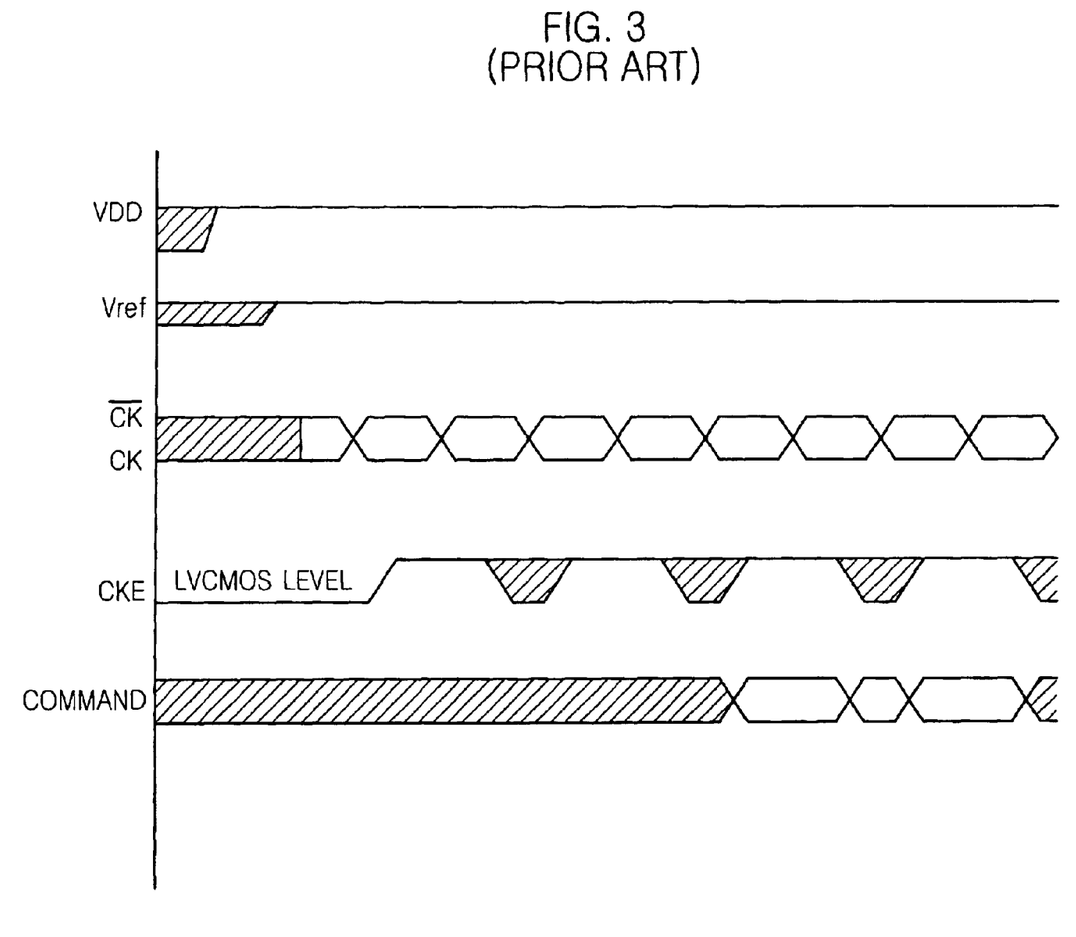
FIG. 3 is a wave form illustrating an operation of the input unit receiving the clock signal in FIG. 1.

FIG. 3 is a waveform illustrating an operation of the input unit receiving the clock signal in FIG. 1. Referring to FIGS. 1 through 3, the reference voltage Vref is inputted into the clock enable buffer 10 after the power voltage VDD is inputted therein and the external clock signals CK and /CK from the external circuit are inputted into the clock buffer 20. The input buffer unit 21 buffers the external clock signals CK and /CK and the clock signal latch unit 22 latches the buffered clock signals CK and /CK.

The clock enable buffer signal CKE is inputted into the clock enable buffer 10 and the clock enable buffer 10 enables the clock signal latch unit 22. When the clock signal latch unit 22 is enabled, the latched external clock signals CK and /CK are outputted from the clock signal latch unit 22.

At this time, the reference voltage Vref and the clock enable buffer signal CKE are inputted in a LVCMOS (Low Voltage CMOS) level to perform a low power and high speed operation, where the LVCMOS level means that a voltage level of an input signal is lower than that of a CMOS level. For example, when the power voltage is 3.3V, the CMOS level has an input signal in a range of 0V to 3.3V, but in the LVCMOS level, the CMOS level is an input signal in a range of 1.7 to 2.5. Accordingly, the LVCMOS level is adopted for the low power and high speed operation.

The internal clock signals CK_I and /CK_I outputted from the clock signal latch unit 22, as a reference signal for the semiconductor device operation, may enables the semiconductor device so that the semiconductor device carries out an operation based on an input command.

However, at the initial time the power voltage VDD is first supplied to the semiconductor device and the clock buffer 10 is then enabled, the clock enable buffer signal CKE and the reference voltage Vref are inputted into the clock enable buffer 10 in a low voltage level. Since the clock enable buffer signal CKE and the reference voltage Vref are inputted in the LVCMOS level, the voltage level of these signals is approximately about 1.7V even if these are in a low voltage level.

Accordingly, in the case where both the clock enable buffer signal CKE and the reference voltage Vref are in a low voltage level of 1.7V, the clock enable buffer 10, which enables the clock signal latch unit 22 by sensing a voltage difference between the clock enable buffer signal CKE and the reference voltage Vref, can enable the clock signal latch unit 22, by estimating that the voltage level of the clock enable buffer signal CKE has higher than that of the reference voltage Vref.

When the clock signal latch unit 22 is enabled, it outputs the internal clock signals CK_I and /CK_I to the semiconductor device using the latched clock signal CK and /CK received from the input buffer unit 21. If the internal clock signals CK_I and /CK_I are inputted into the semiconductor device, the device can operate base on the command to be inputted. However, until the internal clock signals CK_I and /CK_I are inputted into the semiconductor device, the semiconductor device does not receive any command from an external controller. This is the reason why that the semiconductor device can erroneously operate due to the clock enable buffer signal CKE which is activated by an abnormal timing at the initial time the power voltage is supplied.

Therefore, in case of the semiconductor devices in which the clock enable buffer 10 receives LVCMOS level signals using a differential amplifier, it is necessary to appropriately control the operating timing of the clock enable buffer 10 in order to prevent an error at the initial operation.

Furthermore, in semiconductor devices which sense a voltage difference between a clock enable buffer signal and a reference voltage, even though a different level, such as a CMOS level, other than the LVCMOS level is inputted into the semiconductor devices, the above-stated initial operating error is always issued.

SUMMARY OF THE INVENTION

An object of the present invention is to provide a semiconductor device capable of archiving a reliability of an internal clock generation.

Another object of the present invention is to provide a semiconductor device capable of controlling a clock enable buffer in order that a clock buffer to receive an external clock signal and to form an internal clock signal is appropriately enabled without an error.

In accordance with an aspect of the present invention, there is provided a semiconductor device comprising: clock buffer means for receiving and buffering an external clock signal and then outputting an internal clock; clock enable buffer means for comparing a reference voltage Vref having a constant potential with a clock enable buffer signal and then enabling the clock buffer means; and clock enable signal latch means for enabling the clock enable buffer means using the clock enable buffer signal after a power-up signal is inputted.

BRIEF OF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a semiconductor device according to the preferred embodiment of the present invention will be describe in detail below.

Figure 4:
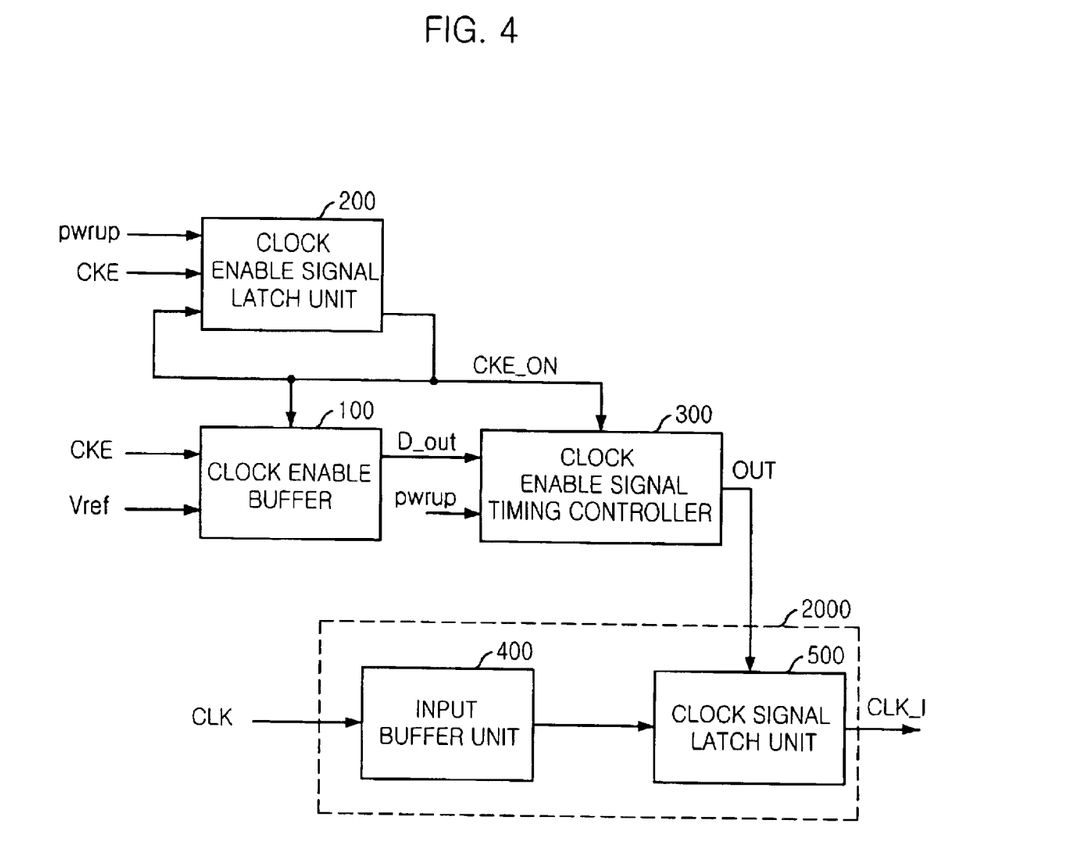
FIG. 4 is a block diagram illustrating a semiconductor device in accordance with a preferred embodiment of the present invention.

First, referring to FIG. 4 showing a block diagram illustrating a semiconductor device in accordance with a preferred embodiment of the present invention, the semiconductor device according to the preferred embodiment includes: a clock buffer 2000 which receives and buffers an external clock signal CLK and outputs the buffered external clock signal CLK as an internal clock signal CLK_I; an clock enable buffer 100 comparing a reference voltage Vref having a constant potential with a clock enable buffer signal CKE and to outputting a first control signal D_out for enabling the clock buffer 2000; and a clock enable buffer signal latch unit 200 which outputs a buffer enable signal CKE_ON to enable the clock enable buffer 100 using the clock enable buffer signal CKE after a power-up signal is inputted.

Further, a semiconductor device according to the present invention includes a clock enable signal timing controller 300 which passes the first control signal D_OUT and outputs a second control signal OUT to the clock buffer 2000 in response to the buffer enable signal CKE_ON or outputs the second control signal OUT to the clock buffer 2000 by delaying the first control signal D_OUT.

The clock buffer 2000 includes an input buffer 400 to receive and buffer the external clock signal CLK and a clock signal latch unit 500 which is enabled according to the second control signal OUT and transfers an output signal of the input buffer 400 to a chip as the internal clock signal CLK_I.

Figure 5:
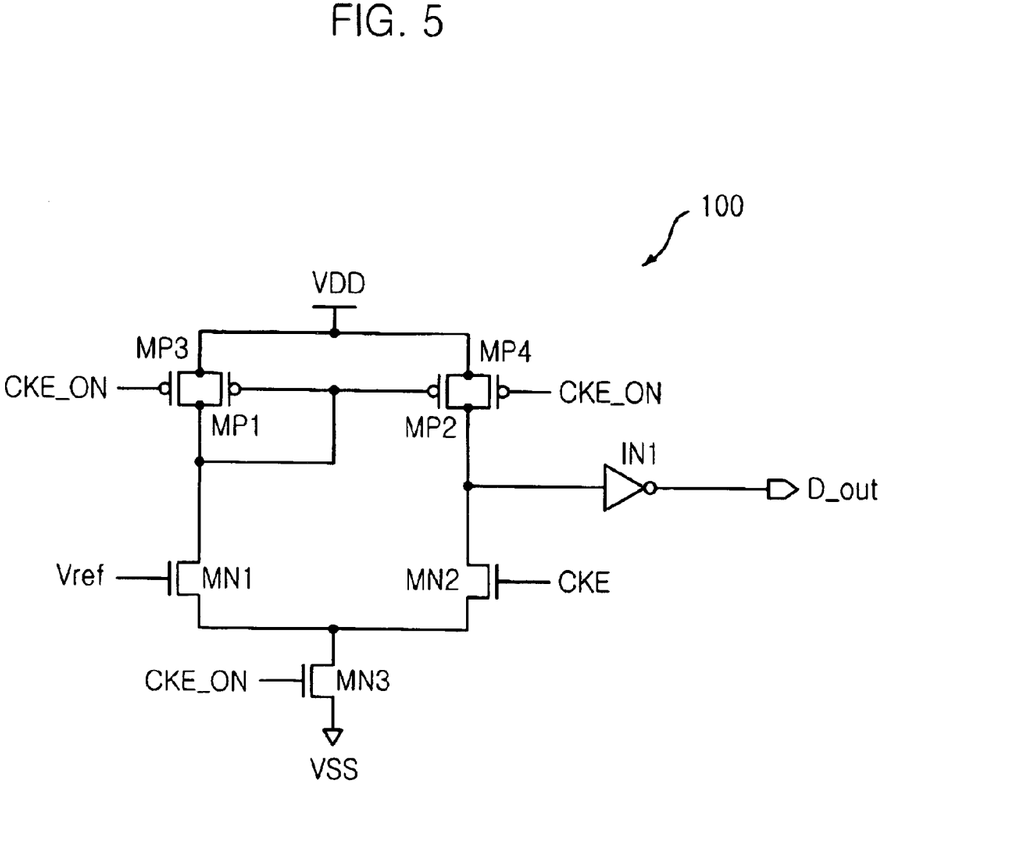
FIG. 5 is a circuit diagram illustrating a clock enable buffer in FIG. 4.

Referring to FIG. 5 showing a circuit diagram illustrating the clock enable buffer in FIG. 4, the clock enable buffer 100 includes: NMOS transistors MN1 and MN2 which have gates receiving the reference voltage Vref and the clock enable buffer signal CKE, respectively; an NMOS transistor MN3 which has a gate receiving the buffer enable signal CKE_ON and is connected to the NMOS transistors MN1 and MN2 and to a ground voltage level VSS; a PMOS transistor MP1 which has a gate connected to the NNOS transistor MN1 in a diode connection and is connected to a power voltage VDD; a PMOS transistor MP2 which is connected to the power voltage VDD and the NMOS transistor MN2 to form a current mirror together with the PMOS transistor MP1; a PMOS transistor MP3 which has a gate receiving the buffer enable signal CKE_ON and is connected to the NMOS transistor MN1 and the power voltage VDD; a PMOS transistor MP4 which has a gate receiving the buffer enable signal CKE_ON and is connected to the NMOS transistor MN2 and the power voltage VDD; and an inverter IN1 for inverting an output signal from the common node of the PMOS transistor MP2 and the NMOS transistor MN2 and outputting the first control signal D_out.

Figure 6:
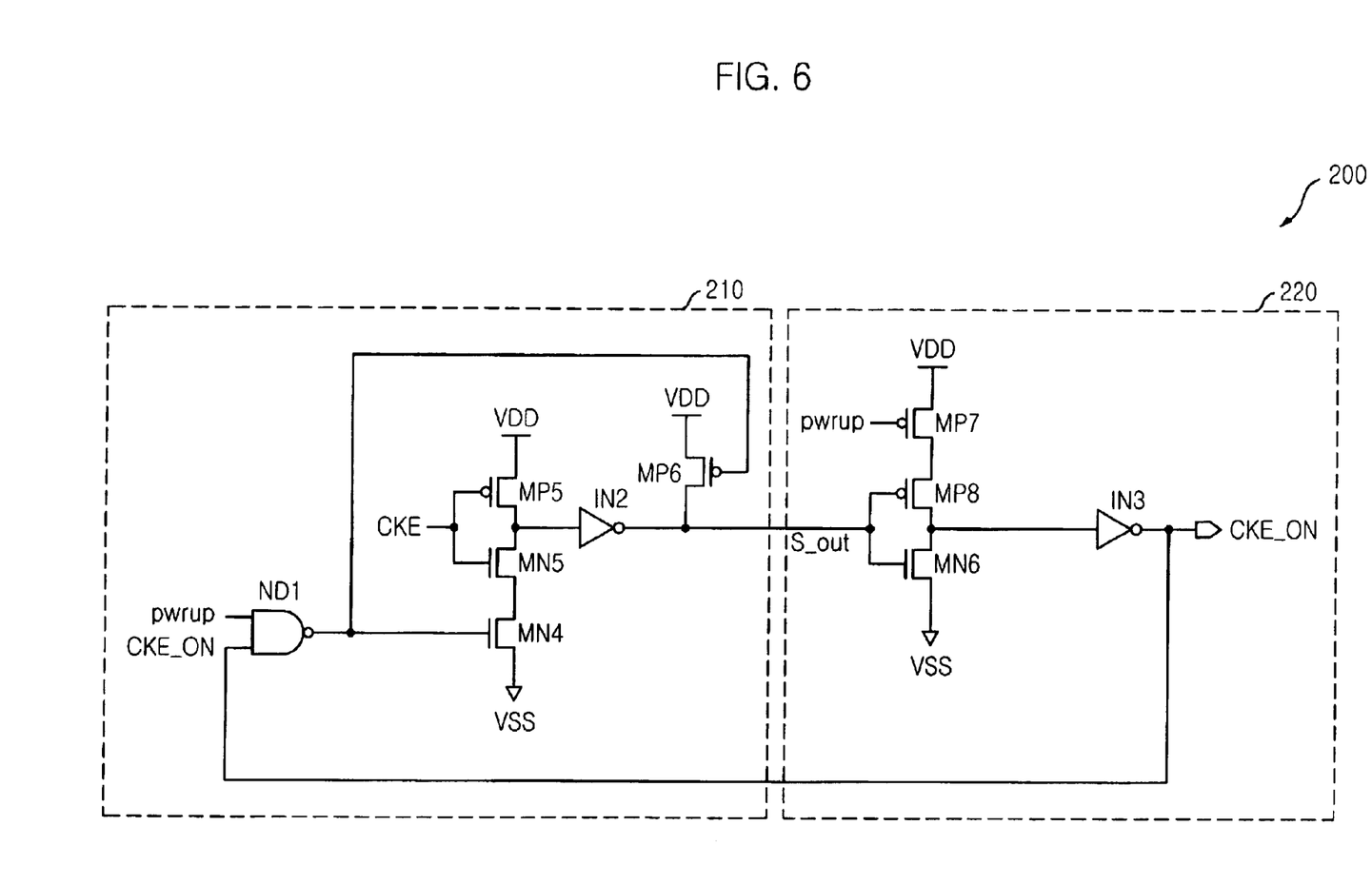
FIG. 6 is a circuit diagram illustrating a latch unit to latch a clock enable buffer signal in FIG. 4.

Referring to FIG. 6 showing a circuit diagram illustrating the latch unit to latch a clock enable buffer signal in FIG. 4, the clock enable buffer signal latch unit 200 includes: a first clock enable buffer signal latch unit 210 which is enabled according to the power-up signal pwrup and is disabled according to the buffer enable signal CKE_ON; and a second clock enable buffer signal latch unit 220 which enables the clock buffer 100 and disables the first clock enable buffer signal latch unit 210 using an output signal S_out from the first clock enable buffer signal latch unit 210. When the external clock signal CLK is inputted into the first clock enable buffer signal latch unit 210 after the first clock enable buffer signal latch unit 210 is enabled, the buffer enable signal CKE_ON from the second clock enable buffer signal latch unit 220 is continuously in a high voltage level.

The first clock enable buffer signal latch unit 210 includes: a NAND gate ND1 receiving the power-up signal pwrup and the buffer enable signal CKE_ON; a first PMOS transistor MP5 which has a gate receiving the clock enable buffer signal CKE and is connected to the power voltage VDD; a first NMOS transistor MN5 which has a gate receiving the clock enable buffer signal CKE and is connected to the first PMOS transistor MP5; a second NMOS transistor MN4 which has a gate receiving an output signal from the NAND gate ND1 and is connected to both the first NMOS transistor MN5 and a ground voltage level VSS; a second PMOS transistor MP6 which has a gate receiving the output signal from the NAND gate ND1 and is connected to both the power voltage VDD; and a first inverter IN2, which is provided between a common node of the first NMOS transistor MN5 and the first PMOS transistor MP5 and the second PMOS transistor MP6, to invert a voltage level on the common node of the first NMOS transistor MM5 and the first PMOS transistor MP5.

The second clock enable buffer signal latch unit 220 includes: a third PMOS transistor MP7 which has a gate receiving power-up signal pwrup and is connected to the power voltage VDD; a fourth PMOS transistor MP8 which has a gate receiving an output signal from the first inverter IN2 and is connected to the third PMOS transistor MP7; a third NMOS transistor MN6 which has a gate receiving the output signal from the first inverter IN2 and is connected to both the fourth PMOS transistor MP8 and the ground voltage level VSS; and an inverter IN3 to invert a voltage level on a common node of the fourth PMOS transistor MP8 and the third NMOS transistor MN6.

Figure 7:
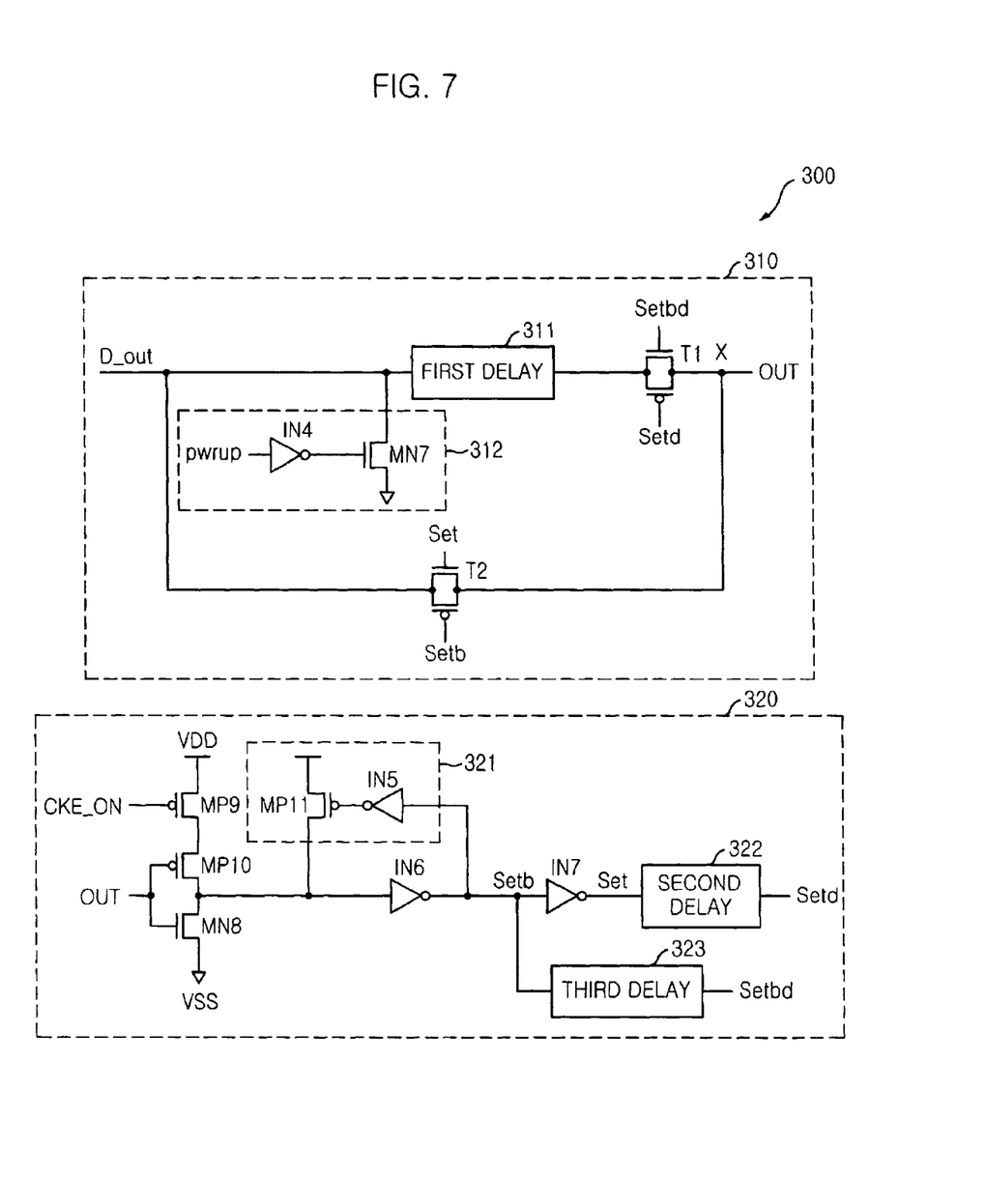
FIG. 7 is a circuit diagram illustrating a controller to control a timing of the clock enable buffer signal in FIG. 4.

FIG. 7 is a circuit diagram illustrating the controller to control a timing of the clock enable buffer signal in FIG. 4. The clock enable signal timing controller 300 includes a clock enable signal path selection unit 310, which passes the first control signal D_out to the clock signal latch unit 500 or outputs a delayed signal to the clock signal latch unit 500 by delaying the first control signal D_out, and a path controller 320 to control the transfer path of the first control signal D_out on the clock enable signal path selection unit 310 in response to the buffer enable signal CKE_ON.

The clock enable signal path selection unit 310 includes a first delayer 311 to delay the first control signal D_out, a first transfer gate T1 to transfer an output of the first delayer 311 to an output terminal X, and a second transfer gate T2 to directly transfer the first control signal D_out to the output terminal X.

The path controller 320 includes: a first PMOS transistor MP9 which has a gate receiving the buffer enable signal CKE_ON; a second PMOS transistor MP10 which has a gate receiving an output signal of the clock enable signal path selection unit 310 and is connected to the first PMOS transistor MP9; a first NMOS transistor MN8 which has a gate receiving the output signal of the clock enable signal path selection unit 310 and is connected to the second PMOS transistor MP10 and the ground voltage level VSS; a first inverter IN6 to invert a voltage level on the common node of the second PMOS transistor MP10 and the first NMOS transistor MN8 and to produce a first turn-on signal Setb turning on the second transfer gate T2; a second inverter IN7 to invert an output signal of the first inverter IN6 and to produce a second turn-on signal Set turning on the second transfer gate T2; a second delayer 322 which is connected to the second inverter IN7 to and produces a third turn-on signal Setbd turning on the first transfer gate T1; and a third delayer 323 which is connected to the first inverter IN6 to and produces a third turn-on signal Setbd turning on the first transfer gate T1.

Figure 8:
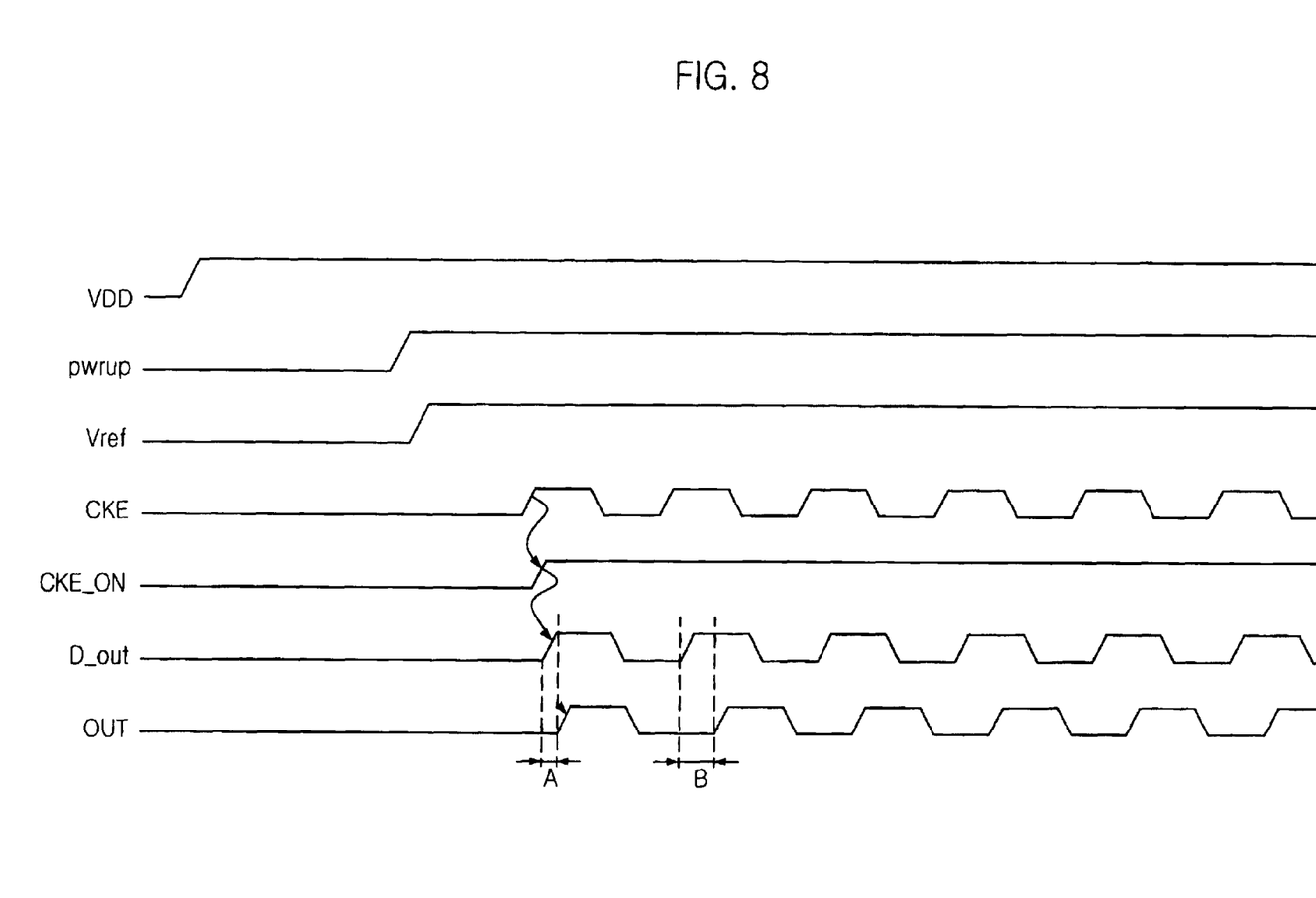
FIG. 8 is a wave form illustrating an operation of the semiconductor device in FIG. 4.

FIG. 8 is a waveform illustrating an operation of the semiconductor device in FIG. 4. Referring to FIG. 8, the semiconductor device according to the present invention uses the power-up signal pwrup. The power-up signal pwrup is used for sensing that a power voltage is stably applied to the semiconductor device at the initial mode. In other words, the creation of the power-up signal pwrup means that stable power voltage is applied to the semiconductor device.

When the power-up signal pwrup is not produced after the power voltage VDD is applied to the semiconductor device, that is, when the power-up signal pwrup of a low voltage level is inputted to the clock enable signal latch unit 200, the output of the NAND gate ND1 in the clock enable signal latch unit 200 is in a high voltage level. Accordingly, the NMOS transistor MN4 is turned on. At this time, since the output of the NAND gate ND1 is in a high voltage level and the clock enable buffer signal CKE is in a low voltage level, the buffer enable signal CKE_ON is in a low voltage level.

Thereafter, the power-up signal pwrup of a high voltage level is produced and inputted into the NAND gate ND1 in the clock enable signal latch unit 200. Also, the reference voltage Vref and the clock enable buffer signal CKE are inputted into the clock enable buffer 100 and the clock enable signal latch unit 200, respectively.

If the clock enable buffer signal CKE goes from low voltage to high voltage and then the high voltage level of the clock enable buffer signal CKE is inputted into the clock enable signal latch unit 200, the NMOS transistor MN5 is turned on and the output of the inverter IN2 is in a high voltage level to make the buffer enable signal CKE_ON be in a high voltage level. If the buffer enable signal CKE_ON is in a high voltage level, the output of the NAND gate ND1 goes from high voltage level to low voltage level and then the output of the inverter IN2 is set in a high voltage level and, at this time, the buffer enable signal CKE_ON is maintained in a high voltage level, irrespective of the voltage level of the clock enable buffer signal CKE. This high voltage maintenance of the enable signal CKE_ON is made because the power-up signal pwrup, which is applied to the gate of the PMOS transistor MP7 in the second clock enable signal latch unit 220, is kept in a high voltage level. That is, since the power-up signal pwrup is kept in a high voltage level, the PMOS transistors MP7 and MP8 are not turned on simultaneously and the power voltage VDD is not transferred to the inverter IN3 even though the output signal S_out of the inverter IN2 is in a low voltage level.

The clock enable signal latch unit 200 makes the continuous high voltage level signal of the buffer enable signal CKE_ON in response to the first high voltage level of the clock enable signal CKE after the power voltage is applied to the clock enable signal latch unit 200 and the power-up signal is produced.

Referring again to FIG. 5, the clock enable buffer 100 is enabled according to the buffer enable signal CKE_ON from the clock enable signal latch unit 200 and compares the clock enable buffer signal CKE with the reference voltage Vref. According to the result of the comparison, the first control signal D_out is outputted. The first control signal D_out is passed through the clock enable signal timing controller 300 and it is outputted as the second control signal OUT in the clock enable signal timing controller 300. The clock signal latch unit 500 receiving the second control signal OUT outputs the internal clock signal CLK_I.

In the semiconductor devices according to the present invention, the buffer enable signal CKE_ON is produced after the power-up signal pwrup has been inputted and, since the clock enable buffer 100 is enabled according to the buffer enable signal CKE_ON, the first control signal D_out is not outputted by an erroneous generation of the reference voltage Vref and the clock enable buffer signal CKE after the initial voltage is applied to the semiconductor device. Namely, the present invention can get rid of an erroneous operation, in which the clock enable buffer signal CKE is acknowledged as a high voltage level signal with respect to the reference voltage Vref because the reference voltage Vref and the clock enable buffer signal CKE are abnormally produced at the initial operation time of the semiconductor device.

Referring again to FIG. 7, since the clock enable signal latch unit 200 receives the clock enable buffer signal CKE and outputs the buffer enable signal CKE_ON and the clock enable buffer 100 produces the first control signal D_out to enable the clock buffer 2000 using the buffer enable signal CKE_ON, a set-up timing margin of the clock enable buffer signal CKE may decrease in comparison with the clock signal CLK. For this reason, the clock enable signal timing controller 300 is provided to control output paths of the first control signal D_out which is produced by the clock enable buffer signal CKE.

The clock enable signal timing controller 300 has two signal paths, one of which passes the first control signal D_out through the clock enable signal path selection unit 310 or the other of which outputs the second control signal OUT to the clock signal latch unit 500 by delaying the first control signal D_out.

In the path controller 320 of the clock enable signal timing controller 300, when the buffer enable signal CKE_ON is in a low voltage level and the second control signal OUT is in a low voltage level, the output signal of the inverter IN6 is in a low voltage level and the output signal of the inverter IN7 is in a high voltage level. Accordingly, since the second transfer gate T2 is turned on and the first transfer gate T1 is turned off, the first control signal D_out is passed through the second transfer gate T2 to form the second control signal OUT and the second control signal OUT is outputted to the clock buffer 2000.

If the output signal of the clock enable signal path selection unit 310 is in a high voltage level, the NMOS transistor MN8 is turned on and the output signal of the inverter IN6 is in a high voltage level. Subsequently, the PMOS transistor MP11 is turned on and the two inverters IN5 and IN6 latch the high voltage level output signal of the PMOS transistor MP11. Thereafter, the second transfer gate T2 is always turned off; however, the first transfer gate T1 is always turned on. As a result, the first control signal D_out is converted into the second control signal OUT via the first delayer 311 and the second control signal OUT is outputted to the clock buffer 2000.

On the other hand, the inverter IN4 and the NMOS transistor MN7 in the clock enable signal path selection unit 310 makes the input terminal thereof be in the ground voltage level at the initial time the power-up signal pwrup is kept in a low voltage level. Namely, in order to overcome a deficient set-up margin when the buffer enable signal CKE_ON is produced and the clock enable buffer 100 is first enabled at the initial operation of the semiconductor device, the first control signal D_out, which is first inputted into in the clock enable signal timing controller 300, is fast outputted as the second control signal OUT after the buffer enable signal CKE_ON is activated in a high voltage level. Thereafter, the subsequent input signals of the first control signal D-out are delayed and the delayed signals are outputted ad the second control signal OUT.

In FIG. 8, the portion "A" denotes a timing when the first control signal D_out passes through the second transfer gate T2 and "B" does when the first control signal D_out passes through the first transfer gate T1.

As apparent from the present invention, the semiconductor device in accordance with the present invention guarantees the stable initial operation by inputting an internal clock signal after the power-up signal input.

While the present invention has been described with respect to certain preferred embodiments, it will be apparent to those skilled in the art that various changes and modifications may be made without departing from the scope of the invention as defined in the following claims.

What is claimed is:

1. A semiconductor device comprising:
   clock buffer means for receiving and buffering an external clock signal and then outputting an internal clock in response to a second control signal;
   clock enable buffer means, which is enabled by a buffer enable signal, for comparing a reference voltage having a constant potential with a clock enable buffer signal and then generating a first control signal;
   clock enable signal timing control means for outputting the second control signal by passing the first control signal to the clock buffer means in response to the buffer enable signal or by delaying the first control signal for a predetermined time; and
   clock enable signal latch means for generating the buffer enable signal after a power-up signal is inputted.

2. The semiconductor device as recited in claim 1, wherein the clock enable signal latch means includes:
   a first clock enable signal latch unit for generating a first output signal according to the power-up signal and the buffer enable signal; and
   a second clock enable signal latch unit for receiving the first output signal to thereby output the buffer enable signal to the first clock enable signal latch unit, the clock enable buffer means and the clock enable signal timing control means.

3. The semiconductor device as recited in claim 2, wherein the first clock enable signal latch unit includes:
   a NAND gate receiving the power-up signal and the buffer enable signal;
   a first PMOS transistor which has a gate receiving the clock enable buffer signal and is connected to a power voltage;
   a first NMOS transistor which has a gate receiving the clock enable buffer signal and is connected to the first PMOS transistor;
   a second NMOS transistor which has a gate receiving an output signal from the NAND gate and is connected to both the first NMOS transistor and a ground voltage level;
   a second PMOS transistor which has a gate receiving the output signal from the NAND gate and is connected to the power voltage; and
   a first inverter connected between the first NMOS transistor and the second PMOS transistor in order to invert a voltage level on the common node of the first NMOS transistor and the first PMOS transistor for generating the first output signal.

4. The semiconductor device as recited in claim 3, wherein the second clock enable signal latch unit includes:
   a third PMOS transistor which has a gate receiving the power-up signal and is connected to the power voltage;
   a fourth PMOS transistor which has a gate receiving the first output signal and is connected to the third PMOS transistor;

a third NMOS transistor which has a gate receiving the first output signal and is connected to both the fourth PMOS transistor and the ground voltage level; and a second inverter to invert a voltage level on a common node of the fourth PMOS transistor and the third NMOS transistor for generating the buffer enable signal.

5. The semiconductor device as recited in claim 2, wherein the clock enable signal timing control means includes:

a clock enable signal path selection unit for outputting the second control signal to the clock buffer means by passing the first control signal to the clock buffer means or by delaying the first control signal; and a path controller to control a transfer path of the first control signal on the clock enable signal path selection unit in response to the buffer enable signal.

6. The semiconductor device as recited in claim 5, wherein the clock enable signal path selection unit includes:

a first delayer to delay the first control signal;

a first transfer gate to transfer an output of the first delayer as the second control signal; and a second transfer gate to directly transfer the first control signal as the second control signal.

7. The semiconductor device as recited in claim 6, wherein the path controller includes:

a first PMOS transistor which has a gate receiving the buffer enable signal;

a second PMOS transistor which has a gate receiving the second control signal and is connected to the first PMOS transistor;

a first NMOS transistor which has a gate receiving the second control signal and is connected to the second PMOS transistor and the ground voltage level;

a first inverter to invert a voltage level on the common node of the second PMOS transistor and the first NMOS transistor and to produce a first turn-on signal turning on the second transfer gate;

a second inverter to invert an output signal of the first inverter and to produce a second turn-on signal turning on the second transfer gate;

a second delayer which is connected to the second inverter to and produces a third turn-on signal turning on the first transfer gate; and a third delayer which is connected to the first inverter to and produces a fourth turn-on signal turning on the first transfer gate.

8. The semiconductor device as recited in claim 7, wherein the path controller further includes:

a third inverter connected to an output terminal of the first inverter; and a third PMOS transistor having a gate to receive an output of the third inverter and being connected to the common node of the second PMOS transistor and the first NNOS transistor.

9. The semiconductor device as recited in claim 6, wherein the clock enable signal path selection unit further includes:

an inverter for inverting the power-up signal; and an NMOS transistor for receiving an output of the inverter to connect an input terminal of the the first delayer to a ground voltage level.

10. The semiconductor device as recited in claim 1, wherein the clock enable buffer means includes:

first and second NMOS transistors which have gates receiving the reference voltage and the clock enable buffer signal, respectively;

a third NMOS transistor which has a gate receiving the buffer enable signal and is connected to the first and second NMOS transistors and to a ground voltage level;

a first PMOS transistor which has a gate connected to the first NMOS transistor in a diode connection and is connected to a power voltage;

a second PMOS transistor which is connected to the power voltage and the second NMOS transistor to form a current mirror together with the first PMOS transistor;

a third PMOS transistor which has a gate receiving the buffer enable signal and is connected to the first NMOS transistor and the power voltage;

a fourth PMOS transistor which has a gate receiving the buffer enable signal and is connected to the second NMOS transistor and the power voltage; and an inverter for inverting an output signal from the common node of the second PMOS transistor and the second NMOS transistor and outputting the first control signal.

11. The semiconductor device as recited in claim 1, wherein the clock buffer means includes:

an input buffer for receiving and buffering the external clock signal; and a clock signal latch unit for transferring an output signal of the input buffer according to the second control signal.

* * * * *